(12) United States Patent
Ting et al.

(10) Patent No.: US 11,121,280 B2
(45) Date of Patent: Sep. 14, 2021

(54) DISPLAY DEVICE WITH IMAGE SENSOR

(71) Applicant: InnoLux Corporation, Miao-Li County (TW)

(72) Inventors: Chin-Lung Ting, Miao-Li County (TW); Li-Wei Mao, Miao-Li County (TW); Shun-Yuan Hu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 23 days.

(21) Appl. No.: 16/567,169

(22) Filed: Sep. 11, 2019

(65) Prior Publication Data
US 2020/0111930 A1 Apr. 9, 2020

Related U.S. Application Data

(60) Provisional application No. 62/740,456, filed on Oct. 3, 2018.

(30) Foreign Application Priority Data

May 17, 2019 (CN) .......................... 201910410058.6

(51) Int. Cl.
| | | |
|---|---|---|
| H01L 31/12 | (2006.01) | |
| H01L 25/16 | (2006.01) | |
| H01L 25/18 | (2006.01) | |
| H01L 33/50 | (2010.01) | |
| H01L 33/32 | (2010.01) | |
| H01L 33/06 | (2010.01) | |

(52) U.S. Cl.
CPC ............ *H01L 31/12* (2013.01); *H01L 25/167* (2013.01); *H01L 25/18* (2013.01); *H01L 33/06* (2013.01); *H01L 33/32* (2013.01); *H01L 33/50* (2013.01)

(58) Field of Classification Search
CPC .......... H01L 31/12; H01L 25/16; H01L 25/18
See application file for complete search history.

(56) References Cited

U.S. PATENT DOCUMENTS

| | | | |
|---|---|---|---|
| 6,454,414 B1 * | 9/2002 | Ting ....................... | H04N 7/144 348/14.07 |
| 10,503,947 B2 | 12/2019 | Liu et al. | |
| 2004/0263670 A1 | 12/2004 | Yamasaki | |
| 2011/0298953 A1 * | 12/2011 | Nakamura ............. | H04N 7/144 348/241 |

(Continued)

FOREIGN PATENT DOCUMENTS

| | | |
|---|---|---|
| WO | 2004/008736 A1 | 1/2004 |
| WO | 2018/059060 A1 | 4/2018 |
| WO | 2018/176852 A1 | 10/2018 |

OTHER PUBLICATIONS

Partial Search Report dated Feb. 13, 2020, issued in application No. EP 19199876.4.

*Primary Examiner* — Sheng-Bai Zhu
(74) *Attorney, Agent, or Firm* — McClure, Qualey & Rodack, LLP

(57) ABSTRACT

A display device is provided. The display device includes a display panel that has a display region. The display device also includes at least one image sensor that overlaps with the display region. The at least one image sensor includes a light-sensing element and at least one light-receiving element disposed on the light-sensing element.

18 Claims, 9 Drawing Sheets

(56) References Cited

U.S. PATENT DOCUMENTS

| | | | |
|---|---|---|---|
| 2012/0092302 A1* | 4/2012 | Imai | G06F 3/0412 |
| | | | 345/175 |
| 2013/0126744 A1* | 5/2013 | Jansen | H01L 31/085 |
| | | | 250/370.08 |
| 2015/0108508 A1* | 4/2015 | Wu | H01L 27/3283 |
| | | | 257/84 |
| 2017/0168200 A1* | 6/2017 | Corcoran | H04N 5/2256 |
| 2017/0337413 A1* | 11/2017 | Bhat | G06K 9/00087 |
| 2017/0352695 A1 | 12/2017 | Tsuchiya | |
| 2017/0365631 A1* | 12/2017 | Iizuka | H01L 27/14636 |
| 2019/0012512 A1 | 1/2019 | He et al. | |

* cited by examiner

DISPLAY DEVICE WITH IMAGE SENSOR

CROSS REFERENCE TO RELATED APPLICATIONS

This application claims priority of China Patent Application No. 201910410058.6 filed on May 17, 2019, and also claims priority of a provisional application of U.S. Patent Application No. 62/740,456 filed on Oct. 3, 2018, the entirety of which are incorporated by reference herein.

BACKGROUND OF THE INVENTION

Field of the Invention

The embodiments of the disclosure relate to a display device, and in particular to a display device including an image sensor.

Description of the Related Art

As digital technology has advanced, display devices are widely used and indispensable to the daily life. In addition, the display devices have been developed to be thinner, lighter, smaller, and more fashionable.

However, the conventional display devices have not been satisfactory in every respect. Therefore, a new display device is needed.

BRIEF SUMMARY OF THE INVENTION

The present disclosure discloses a display device. The display device includes a display panel that has a display region. The display device also includes at least one image sensor that overlaps the display region. The image sensor includes a light-sensing element and at least one light-receiving element that is disposed on the light-sensing element.

The present disclosure also discloses a display device. The display device includes a display panel that has a display region. The display device also includes at least one sensor that overlaps the display region.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

Figure 1:
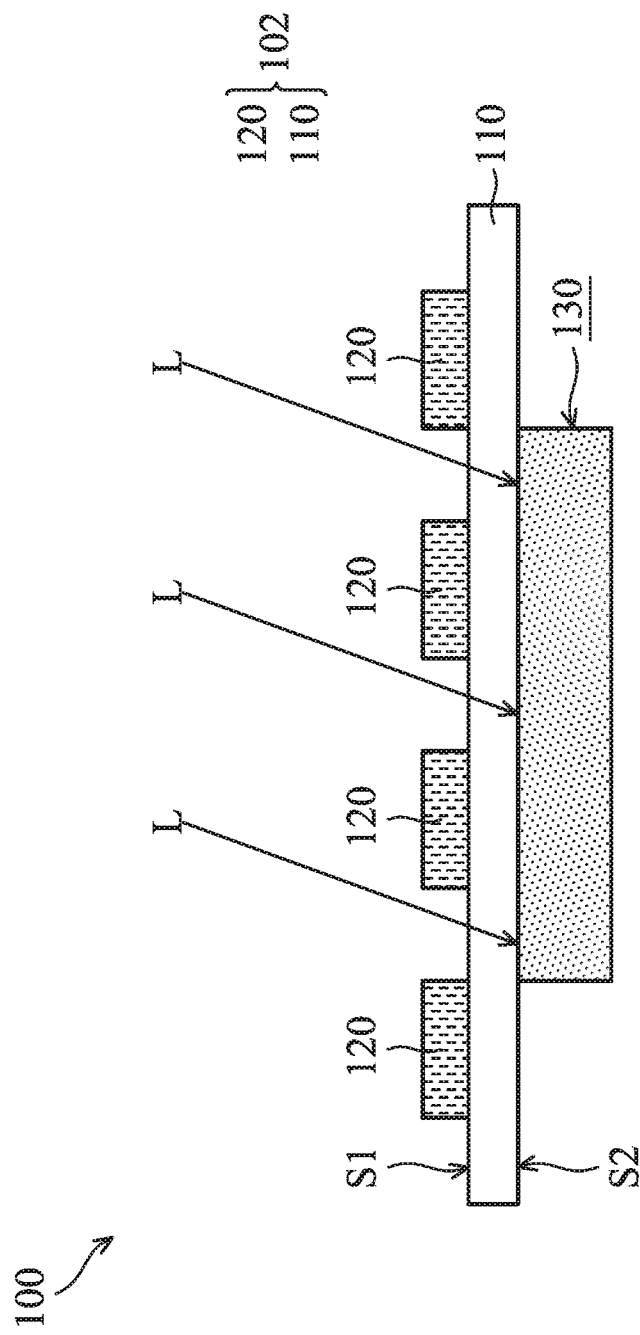
FIG. 1 illustrates a cross-sectional view of a display device in accordance with some embodiments of the present disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate one or more intermediate layers formed between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer". "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper." "horizontal." "vertical,", "above," "below." "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed on a transparent substrate and the layers overlying the transparent substrate, wherein all active elements (ex. transistors) needed may be already formed over the substrate. However, the substrate shown in the accompanying drawings is represented with a flat surface in order to simplify the drawings. The term "substrate surface" is meant to include the uppermost exposed layers on the substrate, such as an insulating layer and/or metallurgy lines.

The thickness of a structure described in the embodiments of the disclosure indicates a value for the average thickness of the structure after deleting outliers. The outliers can be the thickness of an edge, an obvious micro-trench, or an obvious micro-raised area. After deleting the outliers, most values of the thickness are within a range of plus or minus three standard deviations.

Refer to FIG. 1, which illustrates a cross-sectional view of a display device 100 in accordance with some embodiments of the present disclosure. The display device 100 may include modern information apparatus, such as a television, a laptop, a computer, a feature phone, a smartphone, a public information display (PID), a touch display or a tiled display. As shown in FIG. 1, the display device 100 may include a display panel 102; the display panel 102 may include a substrate 110 and light-emitting units 120. The substrate 110 may include, but is not limited to, a flexible or a non-flexible substrate, such as a glass substrate, a polymer substrate, a ceramic substrate, a sapphire substrate, a circuited board, a resin substrate, other suitable substrates or a combination thereof. In some embodiments, the substrate 110 may include a single-layer structure or a multilayer structure. The substrate 110 may include a plurality of active elements (not shown) or active driving circuits (not shown), for example, thin film transistors (TFT). The thin film transistor may include, but is not limited to, a switch transistor, a driving transistor, a reset transistor or other transistors. In some embodiments, the thin film transistor may include at least one semiconductor layer. The material of the semiconductor may include, but is not limited to, amorphous silicon, polysilicon such as low-temp polysilicon (LTPS), metal oxide, other suitable materials or a combination thereof. The metal oxide may include indium gallium zinc oxide (IGZO), indium zinc oxide (IZO), indium gallium zinc tin oxide (IGZTO), other suitable materials, or a combination thereof. For example, in the embodiment where the semiconductor layer is indium gallium zinc oxide (IGZO) layer, the ratio of In, Ga, Zn and O may be 1:1:1:4. In addition, the semiconductor layer may include other compositions, and may be doped with dopants of p-type or n-type.

The substrate 110 may also include passive elements (not shown), such as a capacitor, an inductor or other passive elements. Further, the substrate 110 may also include conductive wires (not shown), which are used to connect to, but is not limited to, thin film transistors or light-emitting units, such as light-emitting units 120 that will be subsequently described. In some embodiments, the substrate 110 may be light transmissive to allow a portion of light pass through. In some embodiments, an average light transmittance of the substrate 110 may be greater than or equal to 5% and less than or equal to 100%. For example, the average light transmittance of the substrate 110 may be greater than or equal to, but is not limited to, 500%, 70% or 80%. For instance, the average light transmittance may be obtained, but is not limited to, by measuring the light transmittances at multiple points, such as three points, and then averaging them, or by measuring an average light transmittance of a selected area, such as an area of 1 mm$^2$.

The display device 100 may include a plurality of light-emitting units 120, which are disposed on a surface S1 of the substrate 110. In some embodiments, the light-emitting units 120 may include, but is not limited to, light-emitting diode (LED), organic light-emitting diode (OLED), quantum dot (QD), quantum-dot-light-emitting diode (QD-LED or QLED), other suitable light-emitting units, or a combination thereof. The LED may include a Mini LED and/or a micro light-emitting diode. The recombination radiation of electron and hole in the p-n junction of the light-emitting diode may produce electromagnetic radiation (such as light). For example, when a forward bias is applied to the p-n junction formed by direct band gap materials such as gallium arsenide (GaAs) or gallium nitride (GaN), the electrons and holes injected into the depletion region recombine and then release energy by photons. The aforementioned electromagnetic radiation may be the visible light or the non-visible light. Materials with different band gaps may be used to produce light with different colors.

In some embodiments, the display device 100 may include a sensor 130. The sensor 130 may be disposed on the surface S2, opposite to the surface S1, of the substrate 110. Although FIG. 1 illustrates merely one sensor 130, the disclosure is not intended to be limited thereto, that is the display device 100 may include more sensors 130. In some embodiments, the sensor 130 may include an image sensor, an optical sensor, an ultrasonic sensor, other suitable sensors or a combination thereof. The image sensor may include a charge coupled device (CCD), a complementary metal-oxide semiconductor (CMOS), other suitable elements, or a combination thereof. In some embodiments, the light source detected by the sensor 130 may include infrared light source, visible light source and/or ultraviolet light source. The sensor 130 may include an infrared light sensor, a visible light sensor, an ultraviolet light sensor or a combination thereof, but is not limited thereto. In some embodiments, light L may penetrate through the substrate 110 and be incident into the sensor 130 because substrate 110 is light transmissive.

Figure 2:
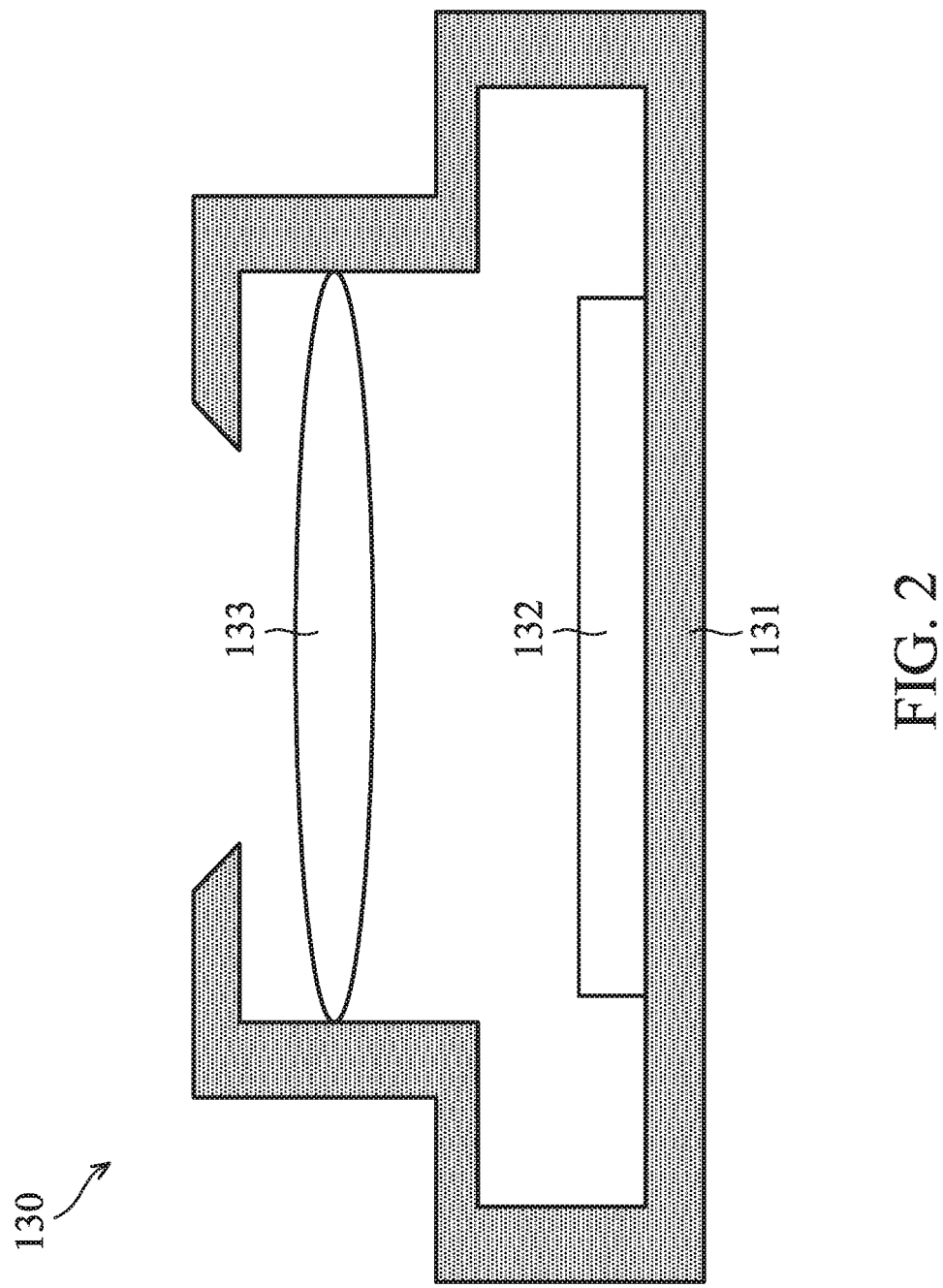
FIG. 2 illustrates a cross-sectional view of an image sensor in accordance with some embodiments of the present disclosure.

As shown in FIG. 2, the sensor 130 may include at least one supporting element 131, at least one light-sensing element 132 and/or at least one light-receiving element 133. To be noted that the sensor 130 may include other elements, such as light filter layer, which is used to let light with specific wavelength pass through. However, the scope of the disclosure is not intended to be limited thereto. In some embodiments, at least one light-receiving element 133 is disposed between the substrate 110 and at least one light-sensing element 132. In some embodiments, the supporting element 131 is configured to support the light-sensing element 132, the light-receiving element 133 and/or other elements or make them be fixed thereon. The supporting element 131 has an opening to allow light be incident into the light-sensing element 132 and at least one light-receiving element 133. In some embodiments, light may be incident into the light-sensing element 132 through at least one light-receiving element 133. In other embodiments, the sensor 130 may not include a supporting element 131, and there may be other layers formed between the light-sensing element 132 and the light-receiving element 133, such as light filter layers (not shown), insulation layers (not shown), light-transmitting layer (not shown), other layers or a combination thereof, but is not limited thereto. In some embodiments, the light-receiving element 133 may be omitted or replaced with other elements. For example, when the sensor 130 is an ultrasonic sensor, the light-receiving element 133 would be omitted; however, the scope of the disclosure is not intended to be limited thereto. The light-sensing element 132 may include a plurality of photodiodes (not shown), which can transform the received light into an electronic signal, transmit the electronic signal to an image processing chip (not shown) and then restore to an image. The light-receiving element 133 may be disposed on the light-sensing element 132 and used to improve, but is not limited to, the sensitivity of the sensor 130. For instance, the light-receiving element 133 may include at least one lens. Alternatively, the light-receiving element 133 may be, but is not limited to, a lens array or be formed by stacking multiple lenses. Although FIG. 2 illustrates that one light-sensing element 132 corresponds to and is disposed on one light-receiving element 133, the scope of the disclosure is not intended to be limited. For example, it may be designed that multiple light-receiving elements 133 constitute an array corresponding to one light-sensing element 132 or that one light-receiving element 133 corresponds to multiple light-sensing elements 132.

Figure 3:
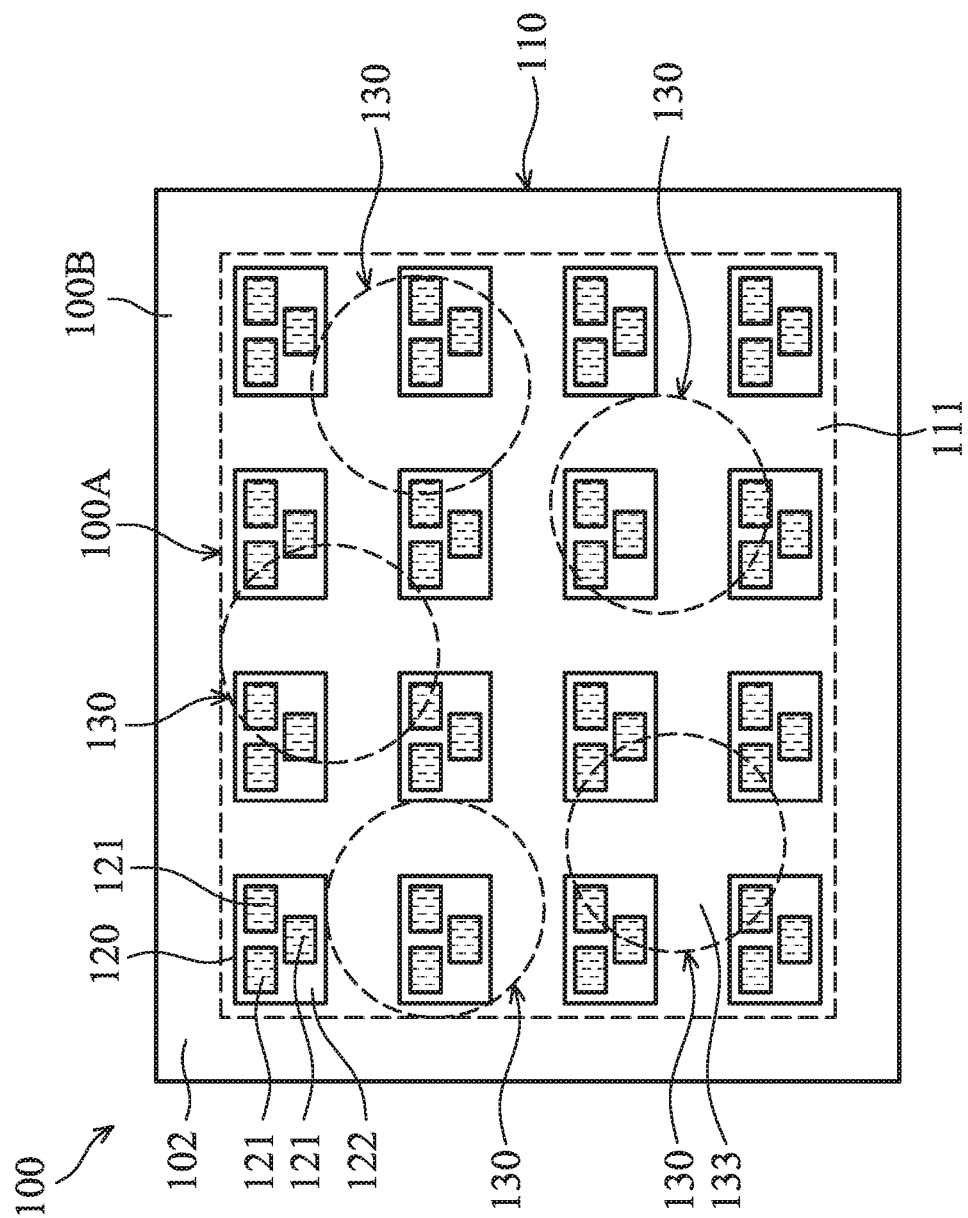
FIG. 3 illustrates a top view of a display device in accordance with some embodiments of the present disclosure.

Refer to FIG. 3, which illustrates a top view of the display device 100 in accordance with some embodiments of the present disclosure. The display panel 102 may include a display region 100A and a non-display region 100B adjacent to the display region 100A; for example, the non-display region 100B may surround the display region 100A. In some embodiments, the display region 100A may be a region that displays an image, and corresponds to the region of the substrate 110 on which the light-emitting units 120 are disposed. The non-display region 100B is not used to display an image, and there are no light-emitting elements 120 disposed on the non-display region 100B. The non-display region 100B may include light shielding elements (not shown) to shield conductive wires or other elements formed on the substrate 110. The light shielding elements may include, but is not limited to, a black photoresist, a black ink, a black resin and/or other suitable light shielding materials. In one embodiment, the light-emitting units 120 may be disposed in the non-display region 100B but shield by the light shielding elements.

In some embodiments, the light-emitting units 120 may include at least one sub-pixel 121. Although FIG. 3 illustrates that one light-emitting unit 120 may include three sub-pixels 121, the disclosure is not intended to be limited thereto, that is one light-emitting unit 120 may include one or more sub-pixels 121, such as four sub-pixels 121. The sub-pixel 121 shown in FIG. 3 may include blue sub-pixel, red sub-pixel, green sub-pixel and white sub-pixel, which emits blue, red, green and white light, respectively; however, the scope of the disclosure is not intended to be limited thereto.

In some embodiments, the light-emitting diodes of the light-emitting units 120 may include a p-type semiconductor layer, an n-type semiconductor layer and a light-emitting layer disposed therebetween. The p-type semiconductor layer provides holes, whereas the n-type semiconductor layer provides electrons: accordingly, the holes and the electrons recombine to generate electromagnetic radiation. The semiconductor layer may include, but is not limited to, aluminum nitride (AlN), GaN, GaAs, indium nitride (InN), aluminum gallium nitride (AlGaN), aluminum indium nitride (AlInN), indium gallium nitride (InGaN), aluminum indium gallium nitride (AlInGaN) or a combination thereof. The light-emitting layer may include, but is not limited to, homojunction, heterojunction, single-quantum well (SQW), multiple-quantum well (MQW) or any other similar structure. In some embodiments, the light-emitting layer includes un-doped n type $In_xGa_{(1-x)}N$. In other embodiments, the light-emitting layer may include other suitable material such as $Al_xIn_yGa_{(1-x-y)}N$. Moreover, the light-emitting layer may include a multiple-quantum well structure with well layers (such as InGaN) and barrier layers (such as GaN) arranged alternately.

In some embodiments, the light-emitting units 120 may include a molding material 122, which surrounds and fixes the sub-pixel 121. The molding material 122 may include a light-transmitting substance and opaque dopants. The material of the substance may include, but is not limited to, silicon oxide, silicon nitride, resin, other suitable material or a combination thereof. Opaque dopants may include, but is not limited to, black materials or light scattering materials. The light-emitting units 120 may further include other elements such as wavelength conversion elements. The wavelength conversion elements may include, but is not limited to, a quantum dot film, a fluorescent material, or other wavelength conversion materials. For example, the wavelength conversion elements may be organic or inorganic layers blended with quantum dots. The material of the quantum dot may include, but is not limited to, zinc, cadmium, selenium, sulfur, indium phosphide (InP), gallium antimonide (GaSb), GaAs, cadmium selenide (CdSe), cadmium sulfide (CdS), zinc sulfide (ZnS) or a combination thereof. The size of the quantum dot may range from about 1 nm to about 30 nm, but the present disclosure is not limited thereto. The light-emitting units 120 may also include light filter layers. The wavelength of light emitted from the light-emitting units 120 may be adjusted by the wavelength conversion elements and/or the light filter layers.

As shown in FIGS. 2 and 3, the display device 100 may include a plurality of sensors 130 disposed in the display region 100A. In some embodiments, a portion of at least one sensor 130 may be disposed in the non-display region 100B. In other embodiments, the display region 100A may have a central region (not shown) far from the non-display region 100B. The plurality of sensors 130 may be disposed in the central region, or the plurality of sensors 130 may overlap the central region. For example, the central region may occupy 50% to 95% of the display region 100A, such as 70%, 80%, 85%, 90%, or 93%. In some embodiments, the light-receiving element 133 has a function of condensing light. To be noted that from a top view, the area of the sensor 130 may be greater than or equal to that of the light-receiving element 133. In addition, the outline of the light-receiving element 133 may include, but is not limited to, circle, oval or other shape. Further, the outline of the sensor 130 may be the same as or different from that of the light-receiving element 133 in the top view. In some embodiments, the sensor 130 may partially overlap with the light-emitting units 120; more specifically, light-receiving element 133 may overlap a portion of the light-emitting units 120. The light, emitted from the light-emitting units 120, would be incident into the light-receiving element 133 through the substrate 110. In some embodiments, the display panel 102 may include a light-receiving region 111 that corresponds to a region of the display region 100A of the substrate 110 where no light-emitting unit 120 is disposed. The light-receiving region 111 may overlap with the display region 100A. In some embodiments, at least a portion of the light-receiving region 111 of the substrate 110 is light transmissive. The average light transmittance of the light-receiving region 111 may be greater than or equal to 1% and less than or equal to 100%, such as 20%, 50%, 70%, 80%, 90% or 95%. In one embodiment, the average light transmittance of the light-receiving region 111 of the substrate 110 may be greater than or equal to 5% and less than or equal to 100%, such as 20%, 50%, 70%, 80%, 90% or 95%.

In some embodiments, the area of one sensor 130 may be greater than that of one light-emitting unit 120 in the top view. In some embodiments, the total area of one sensor 130 may be greater than the area of one light-emitting unit 120 in the top view. For example, the total area of all light-receiving elements 133 in one sensor 130 may be greater than the area of one light-emitting unit 120. In some embodiments, the total area of all light-receiving elements 133 in one sensor 130 may be in a range of, but is not limited to, about 1 $mm^2$ to about 100 $mm^2$, that is, 1 $mm^2$≤the total area≤100 $mm^2$, such as 5 $mm^2$, 10 $mm^2$, 20 $mm^2$ or 50 $mm^2$; however, the scope of the present disclosure is not intended to be limited thereto. The total area may be adjusted according to requirements. In one embodiment where the high resolution is needed, the total area of all light-receiving elements 133 may be greater than or equal to 100 $mm^2$; however, the scope of the disclosure is not intended to be limited thereto. In some embodiments, the total area of all sensors 130 may be less than or equal to the 70% of the area of the display region 100A in the top view. For instance, the total area of all light-receiving elements 133 may be less than or equal to the 70% of the area of the display region 100A in the top view. In addition, the area of the display region 100A may be about 90% of the area of the whole display device 100, and the area of the non-display region 100B may be about 10% of the area of the whole display device 100; however, the scope of the disclosure is not intended to be limited thereto. In some embodiments, one sensor 130 may overlap with multiple light-emitting units 120 in the top view. In some embodiments, where a first area is the overlapping area between the light-receiving element 133 and the light-emitting units 120, the second area is the area of the light-receiving element 133, and the ratio of the first area to the second area is greater than or equal to 0.01 and less than or equal to 0.95—that is, 0.01≤the first area/the second area≤0.95. In the embodiment, the ratio of the area of the light-receiving element 133 of one sensor 130 to the area of one light-emitting unit 120 is greater than 1 and less than 10. In this disclosure, the term "overlap" includes "partially overlap" and "completely overlap".

Figure 4:
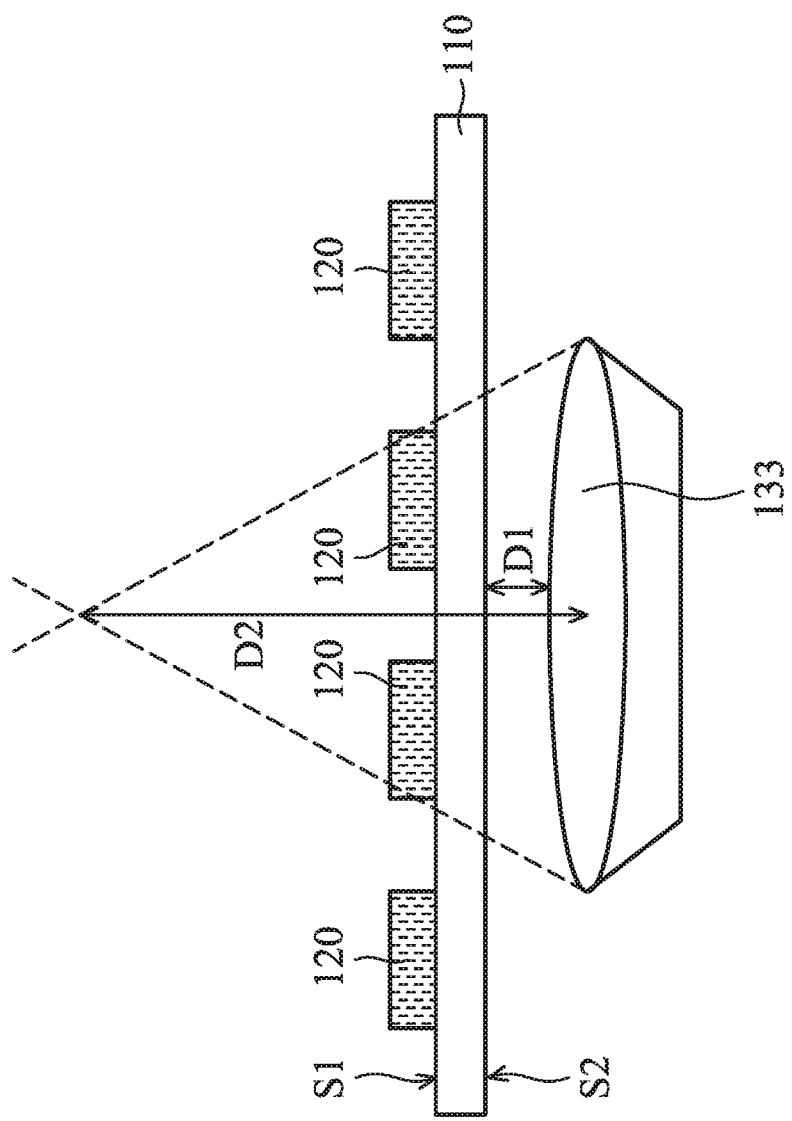
FIG. 4 illustrates a cross-sectional view of a display device in accordance with some embodiments of the present disclosure.

Referring to FIG. 4, which illustrates the relation between the focal length of the light-receiving element 133 of the sensor 130 and the distance between the light-receiving element 133 of the sensor 130 and the substrate 110. Only the light-receiving element 133 is shown in FIG. 4 for brevity. In the normal direction of the surface S2 of the substrate 110, the minimum distance between the light-receiving element 133 and the surface S2 of the substrate 110 is distance D1, and the focal length of the light-receiving element 133 is focal length D2. In some embodiments, the focal length D2 is greater than the distance D1, that is, D2>D1. In some embodiments, the focal length D2 may be greater than or equal to 5 times distance D1, and the focal length D2 may be less than or equal to 1000 times distance D1, that is, 5≤D2/D1≤1000. For example, D2/D1 may be, but is not limited to, 10, 20, 50, 100 or 500. In some embodiments, the sensor 130 may include a light-receiving element 133 with function of optical zoom so that the focal length D2 of the light-receiving element 133 can be adjusted.

Figure 5:
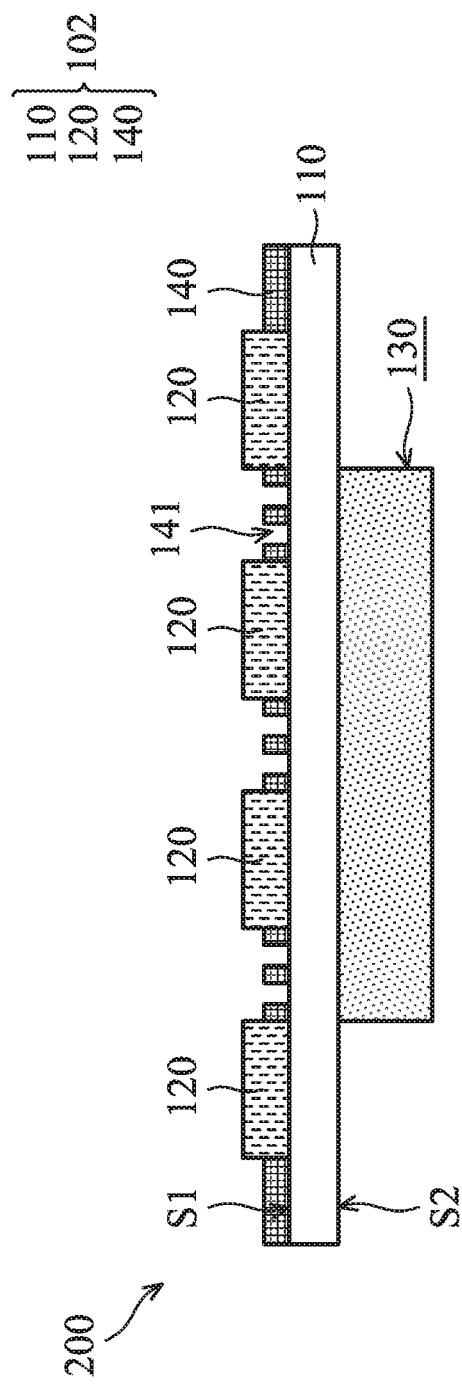
FIG. 5 illustrates a cross-sectional view of a display device in accordance with some embodiments of the present disclosure.

Referring to FIG. 5, which illustrates a cross-sectional view of a display device 200 in accordance with some embodiments of the present disclosure. The display device 200 may be the same as or similar to the display device 100, and one of the differences is that the display panel 102 of the display device 200 may further include a low transmission layer 140. The low transmission layer 140 is disposed on the surface S1 of the substrate 110, and between two adjacent light-emitting units 120. For example, the low transmission layer 140 may be disposed in the light-receiving region 111 as shown in FIG. 3. In some embodiments, the light transmittance of the low transmission layer 140 in the visible spectrum may be less than or equal to 50% and greater than or equal to 0.5%—that is, 0.5%≤light transmittance ≤50%, such as 2%, 5%, 10% or 20%. The light transmittance of the low transmission layer 140 in other spectrum may be less than or equal to 50%; however, the scope of the disclosure is not intended to be limited thereto. The material of the low transmission layer 140 may include a photoresist. In addition, some absorption materials or other materials can be added into the photoresist to control the light transmittance of the low transmission layer 140. In some embodiments, the light transmittance of the low transmission layer 140 may be less than or equal to that of the display device 200.

The absorption materials may include, but is not limited to, zirconium dioxide ($ZrO_2$), potassium niobate ($KNbO_3$), silicon carbide (SiC), gallium phosphide (GaP), gallium arsenide (GaAs), zinc oxide (ZnO), silicon (Si), germanium (Ge), silicon germanium (SiGe), other suitable material or a combination thereof.

In some embodiments, the low transmission layer 140 may be patterned to form a plurality of openings 141 in the region corresponding to the display region 100A, or in the region between two adjacent light-emitting units 120. Light can penetrate substrate 110 and is incident into the sensor 130 through multiple openings 141. The above-mentioned patterned process may include photolithography process and an etching process, wherein the photolithography process includes photoresist coating (e.g., spin-on coating), soft baking, mask alignment, exposure, post-exposure baking, photoresist development, rinsing and drying (e.g., hard baking), other suitable processes or the combination thereof. The photolithography process may also be implemented or replaced by maskless photolithography, electron-beam writing or ion-beam writing. The etching process may include dry etching, wet etching, or other etching methods, such as reactive ion etching.

By forming the low transmission layer 140, the contrast of the display device 200 is improved; as a result, the image of the display device 200 becomes much clearer. Further, in order to improve the contrast of the image and reduce influence on the light sensitivity of the sensor 130, the openings 141 may be formed in the display region 100A, thereby increasing the amount of light being incident into the sensor 130 through the substrate 110. In addition, the quantity and/or the shape of the opening 141 may be adjusted according to the requirements, and the scope of the disclosure is not intended to be limited thereto. Furthermore, a transparent material may be filled into the opening 141 to compensate the strength of the low transmission layer 140.

Figure 6:
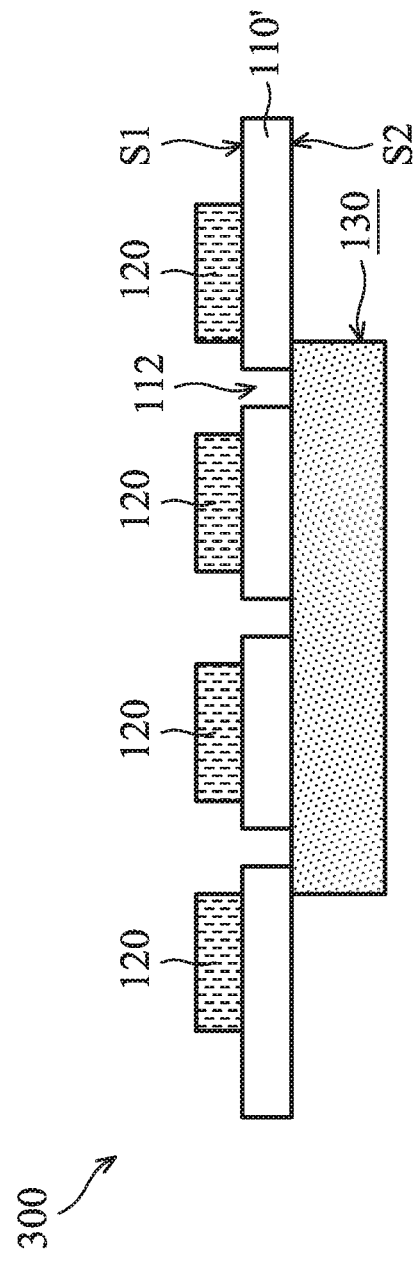
FIG. 6 illustrates a cross-sectional view of a display device in accordance with some embodiments of the present disclosure.

Referring to FIG. 6, which illustrates a cross-sectional view of a display device 300 in accordance with some embodiments of the present disclosure. The display device 300 may be the same as or similar to the display device 100, and one of the differences is that the display device 300 includes a substrate 110'. The substrate 110 of FIG. 1 may be patterned to form the substrate 110' and multiple openings 112 therein. In this embodiment, at least one portion of the sensor 130 is not covered by the substrate 110, wherein the openings 112 expose the portion of the sensor 130. The openings 112 may be formed in the region of the substrate 110' that corresponds to the display region 100A. More specifically, the openings 112 may be formed between two adjacent light-emitting units 120. In some embodiments, the openings 112 may be formed on the region corresponding to the light-receiving region 111, as shown in the top view of FIG. 3. The formation of the openings 112 assists in increasing the amount of light passing through the substrate 110', thereby improving the light sensitivity of the sensor 130 of the display device 300. Moreover, the shape and/or the quantity of the openings 112 may be adjusted according to requirements, and the scope of the disclosure is not intended to be limited thereto. Further, a transparent material may be filled into the openings 112 to compensate the strength of the substrate 110'.

Figure 7A:
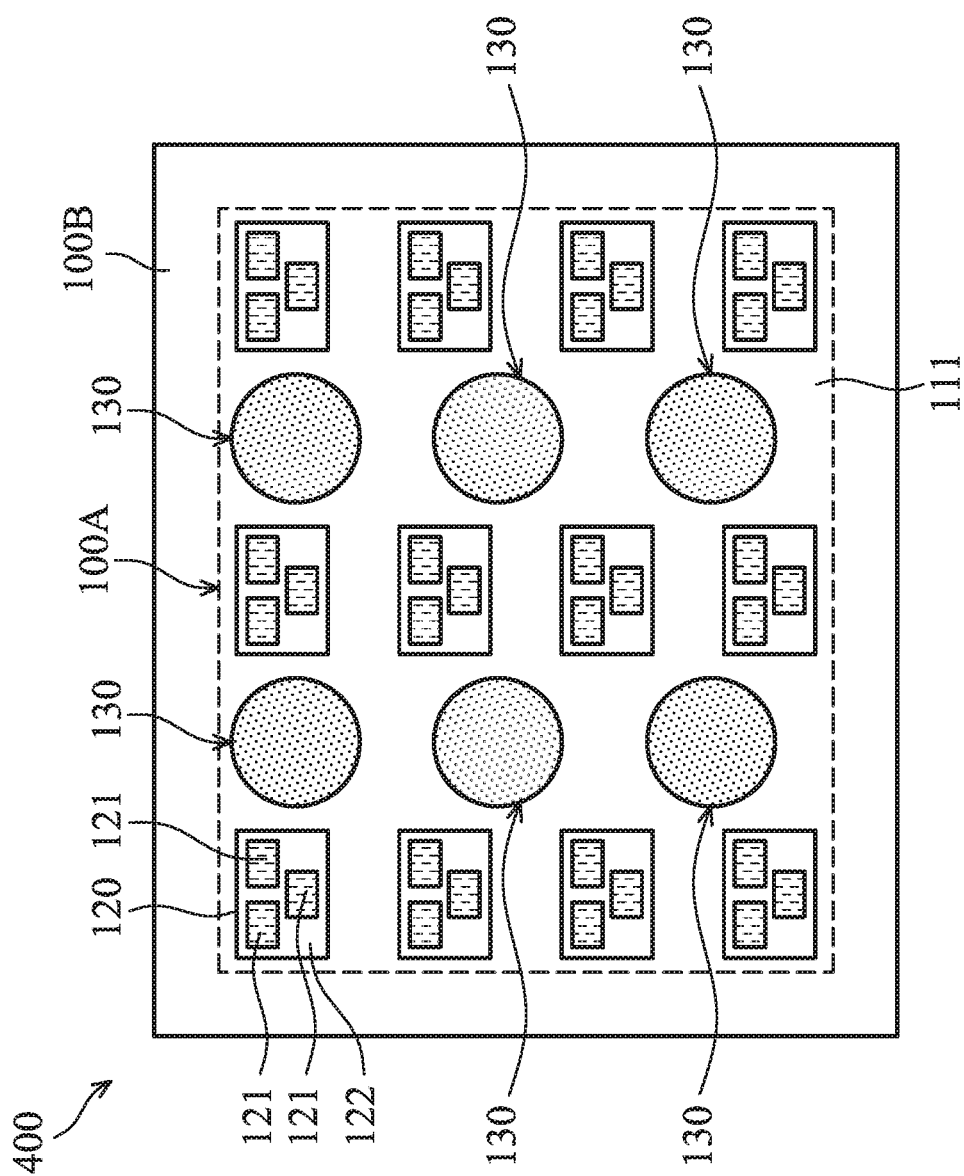
FIG. 7A illustrates a top view of a display device in accordance with some embodiments of the present disclosure.
Figure 7B:
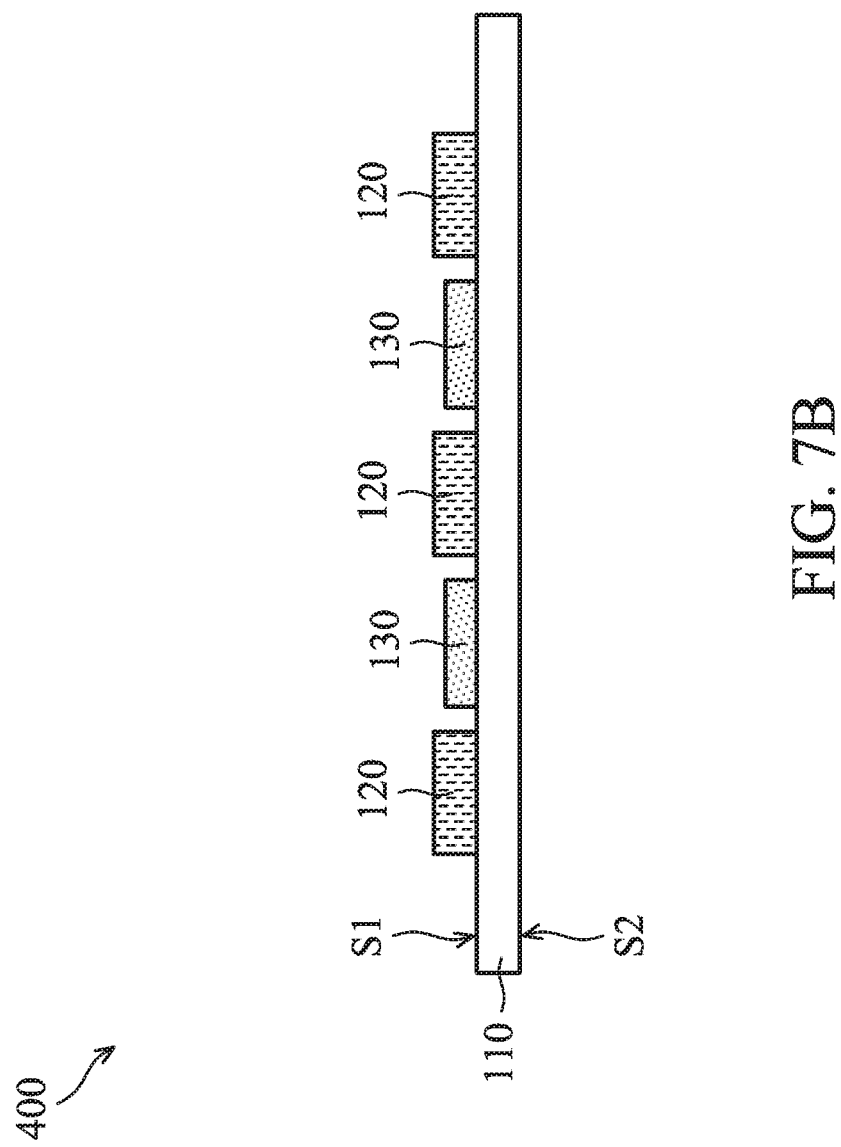
FIG. 7B illustrates a cross-sectional view of the display device shown in FIG. 7A in accordance with some embodiments of the present disclosure.

Referring to FIGS. 7A and 7B, which illustrate the top view and the cross-sectional view of a display device 400 in accordance with some embodiments of the present disclosure. As shown in FIGS. 7A and 7B, the sensor 130 may be disposed on the surface S1 of the substrate 110 and between two adjacent light-emitting units 120. In this embodiment, since the light is incident into the sensor 130 without penetrating the substrate 110, the sensor 130 can receive much more light, thereby improving the light sensitivity of the display device 400.

Figure 8:
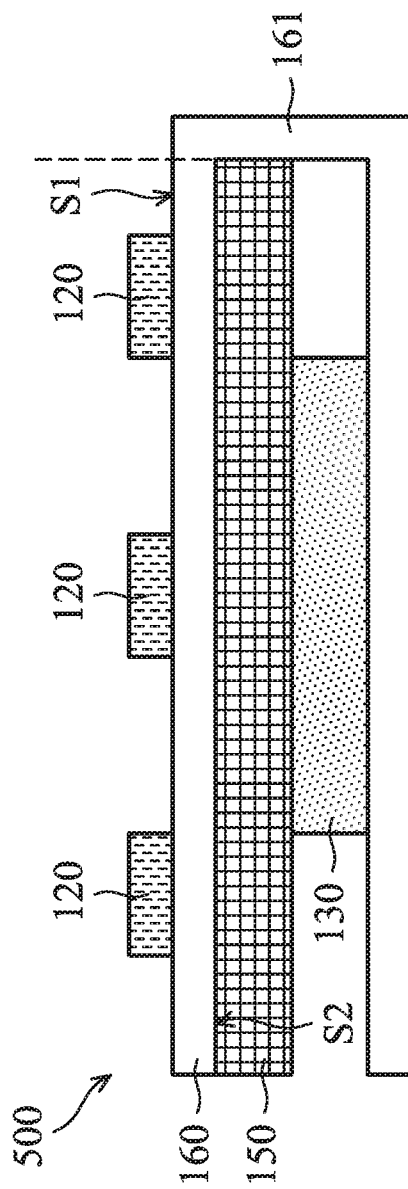
FIG. 8 illustrates a cross-sectional view of a display device in accordance with some embodiments of the present disclosure.

Referring to FIG. 8, which illustrates a cross-sectional view of a display device 500 in accordance with some embodiments of the present disclosure. The display device 500 may be the same as or similar to the display device 100, and one of the differences is that the display device 500 may further include a supporting substrate 150 and a substrate 160 disposed on the supporting substrate 150. The supporting substrate 150 is configured to support the substrate 160. The material of the supporting substrate 150 may include polyimide (PI), polyethylene terephthalate (PET), polyethylene (PE), polyethersulfone (PES), polycarbonate (PC), polymethylmethacrylate (PMMA), polybutylene terephthalate (PBT), polyethylene naphthalate (PEN), glass, acrylic polymer, siloxane polymer, other suitable materials or a combination thereof. In some embodiments, the substrate 160 includes a flexible substrate such as a plastic substrate or other suitable substrate, wherein the material of the plastic substrate may include polyimide, polyethylene terephthalate, polycarbonate, polyethersulfone, polyarylate (PAR), other suitable materials or a combination thereof, but is not limited thereto.

As shown in FIG. 8, the substrate 160 has the surfaces S1 and S2. In some embodiments, the substrate 160 includes an extensive region 161 that may be defined as a bended region of the substrate 160. As shown in FIG. 8, the light-emitting units 120 may be disposed on the surface S1, and the sensor 130 may be disposed on the extensive region 161 of the substrate 160). In this embodiment, the supporting substrate 150 is disposed between the substrate 160 and the sensor 130. The sensor 130 may be disposed between the supporting substrate 150 and the extensive region 161.

In some embodiments, the substrate 160 may include a plurality of active elements such as thin film transistors (not shown), driving the light-emitting units 120 and making them emit light. The substrate 160 may also include passive elements (not shown), such as a capacitor, an inductor or other passive elements. In addition, the substrate 160 includes conductive wires (not shown). By providing the flexible substrate 160, more layouts of circuit can be achieved.

Figure 9:
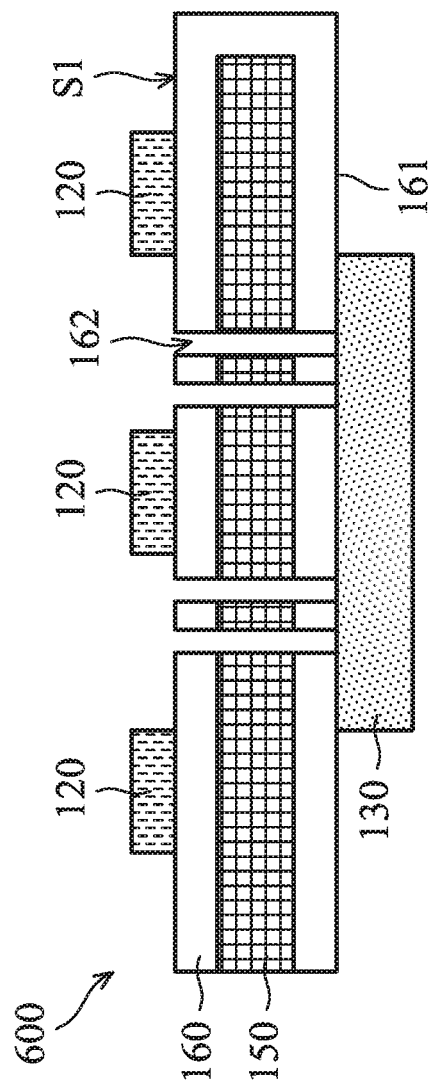
FIG. 9 illustrates a cross-sectional view of a display device in accordance with some embodiments of the present disclosure.

Referring to FIG. 9, which illustrates a cross-sectional view of a display device 600 in accordance with some embodiments of the present disclosure. The display device 600 may be the same as or similar to the display device 500, and one of the differences is that the sensor 130 of the display device 600 is not in direct contact with the supporting substrate 150. As shown in FIG. 9, the sensor 130 is disposed on the extensive region 161 of the substrate 160. In this embodiment, the sensor 130 may be disposed on the surface Si of the substrate 160. Further, the display device 600 may include multiple openings 162 penetrating the supporting substrate 150 and the substrate 160 and extending to the extensive region 161 of the substrate 160. A portion of the sensor 130 is not covered by the supporting substrate 150 and/or the substrate 160. More specifically, the openings 162 expose a portion of the sensor 130. The supporting substrate 150 and the substrate 160 may be patterned to form the openings 162. Where the opening 162 are formed may correspond to the display region 100A, or correspond to the region between two adjacent light-emitting units 120. Light may be incident into the sensor 130 through multiple openings 162. Moreover, the shape and/or the quantity of the opening 162 may be adjusted according to requirements, and the scope of the disclosure is not intended to be limited thereto. Further, a transparent material may be filled into the opening 162.

The display devices 500, 600 shown in FIGS. 8 and/or 9 may be applied to the tiled display device. The tiled display device mentioned above may include multiple display devices 500 and/or the display devices 600 to form a display device with a larger size; however, the scope of the disclosure is not intended to be limited thereto. Other display devices of this disclosure or a combination thereof may also be applied to the tiled display device. In this embodiment, the display panel 102 may at least include substrate 160 and the light-emitting units 120.

Figure 10B:
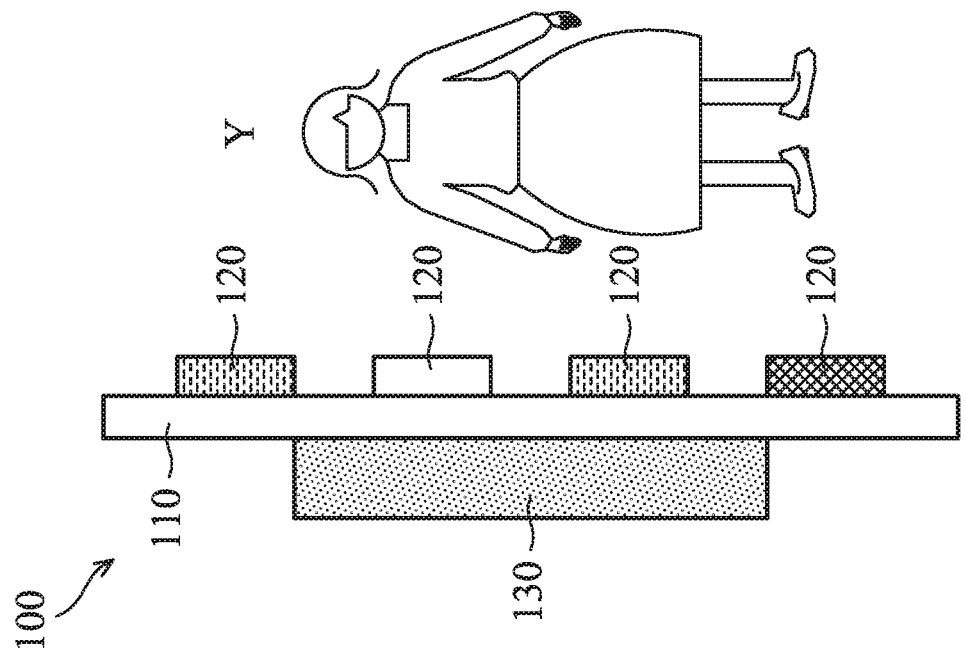
FIGS. 10A and 10B illustrate diagrams that show an interaction between a display device and objects in accordance with some embodiments of the present disclosure.
Figure 10A:
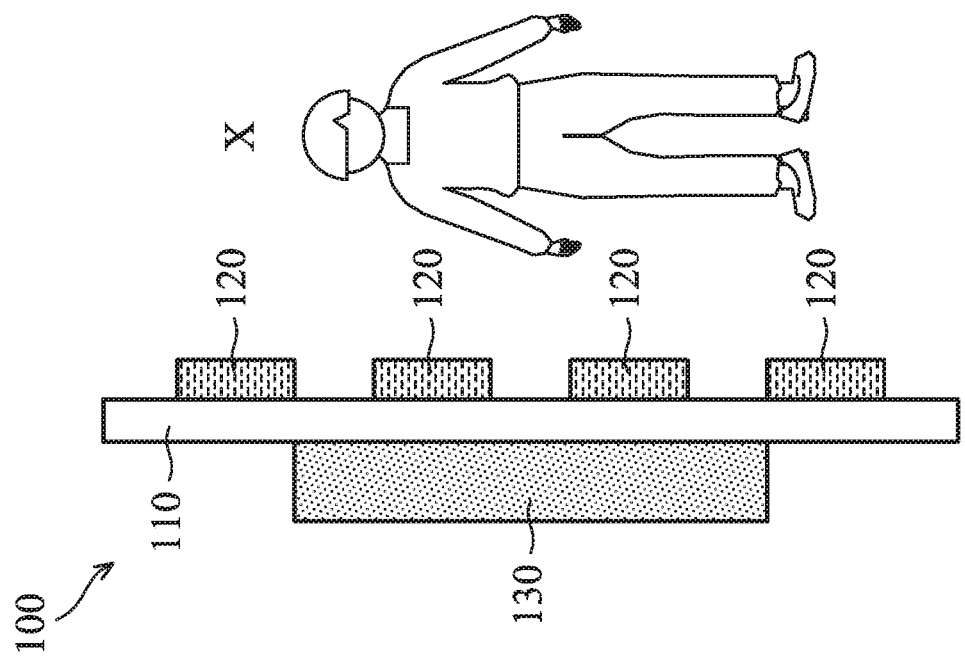

Referring to FIGS. 10A and 10B, which illustrate diagrams that show an interaction between the display device 100 and objects X and Y in accordance with some embodiments of the present disclosure. When different objects pass through the display device 100, the display device 100 will show different images. For example, when objects X and Y are within the sensing region of the display device 100 respectively, the light-emitting units 120 of the display device 100 will emit different light to display different images. To be noted that the display device 100 may be replaced with the display devices 200, 300, 400, 500 or 600; however, the scope of the disclosure is not intended to be limited thereto.

In some embodiments, the image sensor is disposed on the display device to achieve the function of interaction. The image sensor may be used to detect a first image and the display may be used to output a second image or an action corresponding to the first image. For instance, the image may use face recognition to display different images according to the gender of the objects. If the detected object is a male, the image sensor will display men's clothing or goods in which male is interested; if the detected object is a female, the image sensor will display women's clothing or goods in which female is interested; however, the scope of the disclosure is not intended to be limited thereto. In some embodiments, when the image sensor detects someone passing before it, it will display an interface provided for inquiring information.

In some embodiments, the image sensor can be integrated into the display region of the display device. In some embodiments, the image sensor includes a light-sensing element and a light-receiving element. In some embodiments, the image sensor may overlap with the light-emitting units. In some embodiments, the light-emitting units and the image sensor may be disposed on two opposite surfaces of the display panel. In some embodiments, the light-emitting units and the image sensor may be disposed on the same surface of the display panel. The above-mentioned light-emitting units may include a plurality of light-emitting diodes, which are driven by the thin film transistors formed within the display panel. In some embodiments, the area of one light-receiving element is larger than the area of one light-emitting element. In some embodiments, the display panel may be a flexible substrate having an extensive region. The image sensor may be disposed on the extensive region. In some embodiments, the display device includes a low transmission layer formed on the display panel to improve the contrast of image of the display device.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
   a display panel having a display region; and
   at least one image sensor overlapping the display region, wherein one of the at least one image sensor has a focal length, and the focal length is greater than a distance between the one of the at least one image sensor and the display panel, wherein the focal length is greater than or equal to 5 times the distance and less than or equal to 1000 times the distance, and wherein the at least one image sensor comprises:
   a light-sensing element; and
   at least one light-receiving element disposed on the light-sensing element.

2. The display device as claimed in claim 1, wherein the display panel comprises a substrate and a plurality of light-emitting units, the substrate has a first surface and a second surface opposite the first surface, the plurality of light-emitting units are disposed on the first surface, and the at least one image sensor is disposed on the second surface.

3. The display device as claimed in claim 1, wherein the display panel includes a light-receiving region, and the light-receiving region has at least one region with an average light transmittance that is greater than 1% and less than 100%.

4. The display device as claimed in claim 3, wherein the average light transmittance is greater than 5% and less than 100%.

5. The display device as claimed in claim 3, wherein the display panel further includes:
   a low transmission layer disposed in the light-receiving region, wherein the low transmission layer has a plurality of openings.

6. The display device as claimed in claim 1, wherein a total area of the at least one image sensor is less than or equal to 70% of an area of the display region from a top view.

7. The display device as claimed in claim 1, wherein the display panel comprises a plurality of light-emitting units, and one of the at least one light-receiving element overlaps at least one of the plurality of light-emitting units.

8. The display device as claimed in claim 1, wherein the display panel comprises a plurality of light-emitting units, and an area of one of the at least one light-receiving element is greater than an area of one of the plurality of light-emitting units from a top view.

9. The display device as claimed in claim 1, wherein the display panel comprises a plurality of light-emitting units, and the at least one light-receiving element is disposed between the plurality of light-emitting units.

10. The display device as claimed in claim 1, wherein the display panel comprises a substrate, the substrate has an extensive region, and the at least one image sensor is disposed on the extensive region.

11. The display device as claimed in claim 1, wherein the display panel comprises a substrate and a plurality of light-emitting units, and the substrate comprises a plurality of thin film transistors used to drive the plurality of light-emitting units.

12. The display device as claimed in claim 11, wherein at least one of the thin film transistors comprises a semiconductor layer, and a material of the semiconductor layer comprises amorphous silicon, polysilicon or metal oxide.

13. The display device as claimed in claim 1, wherein the display region further comprises a non-display region adjacent to the display region, the display region has a central region far from the non-display region, the central region occupies 50% to 95% of the display region, and the at least one image sensor is disposed in the central region.

14. The display device as claimed in claim 1, wherein the at least one image sensor is used to detect a first image, and the display panel is used to output a second image corresponding to the first image.

15. A display device, comprising:
a display panel having a display region; and
at least one sensor overlapping the display region, wherein one of the at least one sensor has a focal length, and the focal length is greater than a distance between the one of the at least one sensor and the display panel, wherein the focal length is greater than or equal to 5 times the distance and less than or equal to 1000 times the distance.

16. The display device as claimed in claim 15, wherein the at least one sensor comprises an optical sensor or an ultrasonic sensor.

17. The display device as claimed in claim 16, wherein the optical sensor comprises an infrared light sensor, a visible light sensor or an ultraviolet light sensor.

18. The display device as claimed in claim 15, wherein the display panel includes a light-receiving region, and the light-receiving region has at least one region with an average light transmittance that is greater than 1% and less than 100%.

* * * * *